(12) United States Patent
Healey

(10) Patent No.: US 11,166,390 B2
(45) Date of Patent: Nov. 2, 2021

(54) SAFETY CIRCUIT APPARATUS

(71) Applicant: LPW Technology Ltd, Widnes (GB)

(72) Inventor: Callum Healey, Widnes (GB)

(73) Assignee: LPW Technology Ltd, Widnes (GB)

( * ) Notice: Subject to any disclaimer, the term of this patent is extended or adjusted under 35 U.S.C. 154(b) by 0 days.

(21) Appl. No.: 16/768,509

(22) PCT Filed: Nov. 26, 2018

(86) PCT No.: PCT/GB2018/053405
§ 371 (c)(1),
(2) Date: May 29, 2020

(87) PCT Pub. No.: WO2019/106346
PCT Pub. Date: Jun. 6, 2019

(65) Prior Publication Data
US 2020/0305295 A1    Sep. 24, 2020

(30) Foreign Application Priority Data

Nov. 29, 2017  (GB) ..................... 1719841

(51) Int. Cl.
| H05K 5/00 | (2006.01) |
| H05K 5/03 | (2006.01) |
| H05K 5/06 | (2006.01) |
| H05K 7/14 | (2006.01) |

(52) U.S. Cl.
CPC ............ *H05K 5/0069* (2013.01); *H05K 5/03* (2013.01); *H05K 5/069* (2013.01); *H05K 7/1427* (2013.01)

(58) Field of Classification Search
USPC ......................... 361/752, 796, 800
See application file for complete search history.

(56) References Cited

U.S. PATENT DOCUMENTS

| 3,193,710 A | 7/1965 | Elliot |
| 3,309,542 A | 3/1967 | Elliot |
| 3,445,679 A | 5/1969 | Meyer et al. |

(Continued)

FOREIGN PATENT DOCUMENTS

| DE | 102015122468 A1 | 6/2017 |
| FR | 2908011 A1 | 5/2008 |
| WO | WO 2016/140832 A1 | 9/2016 |

*Primary Examiner* — Hung S. Bui
(74) *Attorney, Agent, or Firm* — Leydig, Voit & Mayer, Ltd.; Gerald T. Gray

(57) ABSTRACT

Apparatus electronically interconnecting first electronic circuitry (72) in a hazardous environment with second electronic circuitry (74) whilst partitioning the second electronic circuitry from the hazardous environment includes a metallic body (42) defining a passage (56) which opens at one end into the hazardous environment. A PCB (58) extends across the passage and is encased within a layer of insulating material (66) on one side to form a gas tight barrier across the passage. The PCB has a first connector (78) connected with said first electronic circuity and at least one second connector (80) extending through the layer of insulating material and connected with said second electronic circuitry. The first and second connectors are electronically coupled so that the first electronic circuitry is electronically connected with the second electronic circuity through the PCB and insulating layer.

18 Claims, 3 Drawing Sheets

(56) References Cited

U.S. PATENT DOCUMENTS

| | | | |
|---|---|---|---|
| 6,305,975 B1 | 10/2001 | Steiner | |
| 2007/0230137 A1* | 10/2007 | Inagaki | H05K 7/20854 361/719 |
| 2009/0200489 A1 | 8/2009 | Tappel et al. | |
| 2009/0311975 A1* | 12/2009 | Vanderaa | G05B 19/4185 455/90.3 |
| 2011/0181003 A1 | 7/2011 | Hayashi et al. | |

\* cited by examiner

SAFETY CIRCUIT APPARATUS

CROSS REFERENCES

This Application claims priority to International Application No. PCT/GB2018/053405 by Healey entitled, "SAFETY CIRCUIT APPARATUS," filed Nov. 26, 2018, and United Kingdom Application No. 1719841.7, by Healey entitled "SAFETY CIRCUIT APPARATUS," filed Nov. 29, 2017. Both applications are incorporated in their entirety herein by reference.

TECHNICAL FIELD OF THE INVENTION

The present invention relates generally to apparatus incorporating a safety circuit arrangement. The invention relates in particular, but not exclusively, to a sensor module incorporating a safety circuit arrangement for use with a container, especially a pressurised container for the storage and/or transport of powder and other particulate material.

BACKGROUND TO THE INVENTION

It is known to store and transport particulate material in a container which is pressurised using quantity of inert gas under pressure. Such pressurised containers are used for the storage and transportation in particular of specialised powders, such as those used in additive layer manufacturing (ALM) or additive manufacturing (AM). A particular concern is to ensure that the powder is in a usable condition when delivered to its point of use.

To address this issue, we have proposed in WO 2016/046539 A2 a pressurised powder container having a system for actively monitoring conditions within the container. The container has a pressure chamber in which the powder is held together with a quantity of pressurised gas. The monitoring system includes a number of sensors for detecting various parameters within the pressure chamber. The sensors are connected with a control unit located externally of the chamber which records and logs the sensor readings and has a communications module adapted to relay the sensor readings, or log files, to a remote monitoring station.

The interior of the pressure chamber is a potentially hazardous environment that could present an explosion risk if ignited. Often such containers are used to store and transport explosive powders or aluminium powders which may generate hydrogen if it comes into contact with water. Accordingly, the sensors, and any other any parts of the monitoring system which come into contact with the pressurised gas/powder, must not present an ignition source during normal use so that the monitoring system can be operated safely. Electronics devices and circuitry that are safe to use within an explosively hazardous environment include devices and circuitry designated as "intrinsically safe". These are designed to minimise the risk of producing an ignition source in normal use. Any components or parts of the monitoring system which are not safe for use in the pressure chamber are located externally of the chamber and fluidly isolated from the interior of the chamber but must be electronically connected with the safe components located within the hazardous environment.

There are numerous other applications where it is necessary to be able to locate safe parts of an electronic system within an explosively hazardous environment and to connect these with other parts of the electronic system that need to be isolated from the hazardous environment. These might include other sensing arrangements or control systems, for example.

There is a need then for improved or alternative apparatus comprising a safety circuit arrangement for partitioning first electronic circuitry suitable for use in a hazardous environment from second electronic circuitry which may not be suitable for use in a hazardous environment whilst maintaining electrical connectivity between the first and second electronic circuitry and which overcomes, or at least mitigates, the drawbacks of known apparatus.

There is also a need for apparatus comprising a container and an electronic module in which the electronic module incorporates an improved or alternative safety circuit arrangement for effectively partitioning first electronic circuitry suitable for use in a hazardous environment from second electronic circuitry which may not be suitable for use in a hazardous environment whilst maintaining electrical connectivity between the first and second electronic circuitry and which overcomes, or at least mitigates, the drawbacks of known apparatus.

There is a need in particular for an improved or alternative sensor module for monitoring a hazardous environment, such as the interior of a pressurised powder container, which overcomes, or at least mitigates, the drawbacks of known sensor modules.

There is a still further need for a gas pressurised powder container that has a system capable of monitoring the environment inside the container and in which components of the monitoring system which could present an ignition risk in use are effectively isolated from the contents of the interior of the container.

SUMMARY OF THE INVENTION

According to a first aspect of the invention, there is provided apparatus including a safety circuit arrangement for electronically interconnecting first electronic circuitry in a hazardous environment with second electronic circuitry whilst partitioning the second electronic circuitry from the hazardous environment, the apparatus comprising:

a) a body defining a passage which opens at one end into the hazardous environment;

b) a PCB mounted to the body so as to extend across and close the passage, the PCB being encased within a layer of insulating material on the side of the PCB facing away from said one end of the passage, the PCB and insulating layer forming a gas tight barrier across the passage;

c) the PCB having at least one first connector connected with said first electronic circuitry located in the hazardous environment and at least one second connector extending through the layer of insulating material and connected with said second electronic circuitry;

d) the at least one first connector and the at least one second connector being electronically coupled such that the first electronic circuitry is electronically connected with the second electronic circuity through the PCB and insulating layer.

At least that part of the body which defines the passage may made of a metallic material.

The first electronic circuitry is suitable for use in the hazardous environment and may be intrinsically safe.

The passage may be fluidly connected to the hazardous environment at said one end, or otherwise provide access to the hazardous environment at said one end in use.

In an embodiment, the apparatus comprises a sensor arrangement for monitoring one or more characteristics in the hazardous environment, the first electronic circuitry comprising at least one sensor for monitoring one or more parameters of the hazardous environment and the second electronic circuitry comprising other components of the sensor arrangement.

The apparatus may form part of a module which, at least in use, is mounted to a container having an interior volume such that said passage is fluidly connected at said one end with the interior volume. The module may be releasably mountable to said container or permanently mounted to the container.

In accordance with a second aspect of the invention, there is provided apparatus comprising a container having an interior volume and an electronic module, the electronic module comprising a body defining a passage connected at one end with the interior volume of the container:

a) PCB mounted to the body so as to extend across and close the passage, the PCB having a first side proximal said one end of the passage and a second side distal from said one end of the passage, the PCB being encased within a layer of insulating material which extends across the passage on the second side of the PCB, the PCB and insulating layer forming a gas tight barrier which partitions the apparatus into a hazardous region to the side of the barrier proximal said one end of the passage and a non-hazardous region to the side of the barrier distal from said one end of the passage, the hazardous and non-hazardous regions being fluidly isolated from one another by said barrier;

b) the PCB having at least one first connector connected with said first electronic circuity located in the hazardous region and at least one second connector extending through the layer of insulating material and connected with said second electronic circuitry located in the non-hazardous region;

c) the at least one first connector and the at least one second connector being electronically coupled such that the first electronic circuitry is electronically connected with the second electronic circuity through the PCB and the insulating layer.

At least that part of the module body which defines the passage may made of a metallic material.

The container may be a pressurised container. The interior volume of the container may be a pressure chamber for holding a quantity of pressurised gas and a quantity of powder.

The electronic module may comprise a sensor arrangement for monitoring one or more parameters of the interior volume of the container, the first electronic circuitry comprising at least one sensor for monitoring one or more parameters of the interior volume and the second electronic circuitry comprises other components of the sensor arrangement.

In accordance with a third aspect of the invention, there is provided apparatus comprising a sensor module for monitoring one or more parameters of an interior volume of a pressurised powder container, the sensor module having a body defining a passage and being mountable to a pressurised powder container such that the passage is connected at one end with an interior volume of the container:

a) a PCB mounted to the body so as to extend across and close the passage, the PCB having a first side proximal said one end of the passage and a second side distal from said one end of the passage, the PCB being encased within a layer of insulating material which extends across the passage on the second side of the PCB, the PCB and insulating layer forming a gas tight barrier which partitions the apparatus into a hazardous region to the side of the barrier proximal said one end of the passage and a non-hazardous region to the side of the barrier distal from said one end of the passage, the hazardous and non-hazardous regions being fluidly isolated from one another by said barrier;

b) the PCB having at least one first connector connected with said first electronic circuity located in the hazardous region and at least one second connector extending through the layer of insulating material and connected with said second electronic circuitry located in the non-hazardous region;

c) the at least one first connector and the at least one second connector being electronically coupled such that the first electronic circuitry is electronically connected with the second electronic circuity through the PCB and insulating layer.

At least that part of the sensor module body which defines the passage may made of a metallic material.

The container may be a hopper for the storage and transport of metallic powder for use in AM and/or ALM. The hopper may be configured to dispense powder into an AM and/or ALM machine.

In an embodiment, the first electronic circuitry comprises at least one sensor for monitoring one or more parameters of the interior volume of a container in use and the second electronic circuitry comprises other components of the sensor arrangement.

In apparatus according to any one of the first, second, or third aspects of the invention set out in the paragraphs above, the insulating layer may be selected from the group comprising: a potting compound; melted glass; or brazed ceramics. The insulating layer may comprise Electrotemp Cement Powder No. 10 manufactured by Glassbond Sauereisen®.

In an embodiment of apparatus according to any one of the first, second, or third aspects of the invention set out in the paragraphs above, the passage comprises a stepped bore defined in the body, the stepped bore having adjacent first and second portions, the first portion being further from said one end of the passage than the second portion and having a lager diameter than the second portion, the body defining a shoulder at the intersection of the first and second portions of the bore which shoulder is directed away from said one end of the passage, the PCB being mounted to the shoulder within the first portion of the bore. A seal may be provided between the PCB and the shoulder. In an embodiment, the stepped bore comprises a third portion adjacent the second portion at the opposite end of the second portion from the first portion, the third portion having a larger diameter than the second portion and the body defining a second shoulder at the intersection between the second and third portions of the bore, the first electronic circuitry including a further PCB mounted to the second shoulder within the third portion of the bore and electronically coupled to the first PCB.

In apparatus according to any one of the first, second, or third aspects of the invention set out in the paragraphs above, the body may define a housing within which at least part of the second electronic circuitry is contained. The body may comprise a main housing body portion including a base and a peripheral wall extending from the base to define with the base an interior volume within which at least part of the secondary electric circuitry is located. The body may also comprise a closure member releasably mountable to the main body portion and engageable with an end of the peripheral wall distal from the base. The peripheral wall may be cylindrical and an outer surface of the closure member may be dome shaped. The closure member may be held in position on the main body portion by a number of releasable fasteners. The closure member may have one or more recesses in an outer surface, in each of which one or more of the fasteners are located, the closure member having a corresponding number of inserts, each insert being insertable in a respective recess so as to cover the fastener or fasteners after the closure member is mounted to the main body portion. In an embodiment, the closure member has an annular recess in which the fasteners are located and a correspondingly shaped annular insert. Where the outer surface of the closure member is dome shaped, the outer surface of the/each insert may be profiled to conform to the domed profile of the closure member outer surface. The base may comprises a central boss in which the passage is defined, for example as a stepped bore as discussed above.

In apparatus according to any one of the first, second, or third aspects of the invention set out in the paragraphs above wherein the first electronic circuitry comprises at least one sensor, the at least one sensor may comprise any one or more selected from the group comprising: an oxygen sensor; a humidity sensor; an electrostatic sensor; a temperature sensor; and a pressure sensor.

In apparatus according to any one of the first, second, or third aspects of the invention set out in the paragraphs above wherein the second electronic circuitry comprises other components of a sensor arrangement, the other components of the sensor arrangement may comprise any one or more selected from the group comprising: a battery; an ECU (which may be a PIC); a communications unit; an antenna.

In apparatus according to any of the first, second and third aspects of the invention as set out in the paragraphs above, a filter may be provided to filter fluid entering the passage at said one end. In an embodiment, a filter cover is mounted to the body defining the passage to enclose an opening of the passage at said one end, the filter cover having a filtered aperture through which gas passes in use to enter the passage. The filter may be a PTFE filter.

In accordance with a fourth aspect of the invention, there is provided a method of fluidly isolating "un-safe" electronic circuitry from "safe" electronic circuitry suitable for use in a hazardous environment whilst maintaining electrical connectivity between them, the method comprising forming a gas tight barrier within passageway fluidly connected or connectable with a hazardous environment at one end by means of a PCB extending across the passageway and encasing the PCB in a layer of insulating material on at least one side of the PCB which insulating layer extends fully across the passageway, and using the PCB to establish an electrical connection between the safe and un-safe electronic circuitry.

The method according to the fourth aspect of the invention may be carried out using apparatus according to any one of the first, second and third aspects of the invention as set out in the paragraphs above.

In accordance with a fifth aspect of the invention, there is provided safety circuit apparatus for fluidly isolating "un-safe" electronic circuitry from "safe" electronic circuitry suitable for use in a hazardous environment whilst maintaining electrical connectivity between them, the apparatus comprising a gas tight barrier within passageway fluidly connected or connectable with a hazardous environment at one end, the gas tight barrier comprising a PCB extending across the passageway and encased on at least one side in a layer of insulating material, which insulating layer extends fully across the passageway, the safe and un-safe electronic circuitry being electronically connected through the PCB.

The PCB may be coupled with at least one of the un-safe and safe electronic circuitry by means of at least one electronic connector extending through the insulating layer.

The apparatus according to the fifth aspect of the invention may have any of the features of the apparatus according to any one of the first, second and third aspects of the invention as set out in the paragraphs above.

DETAILED DESCRIPTION OF THE INVENTION

In order that the invention may be more clearly understood one or more embodiments thereof will now be described, by way of example only, with reference to the accompanying drawings, of which:

Figure 1:
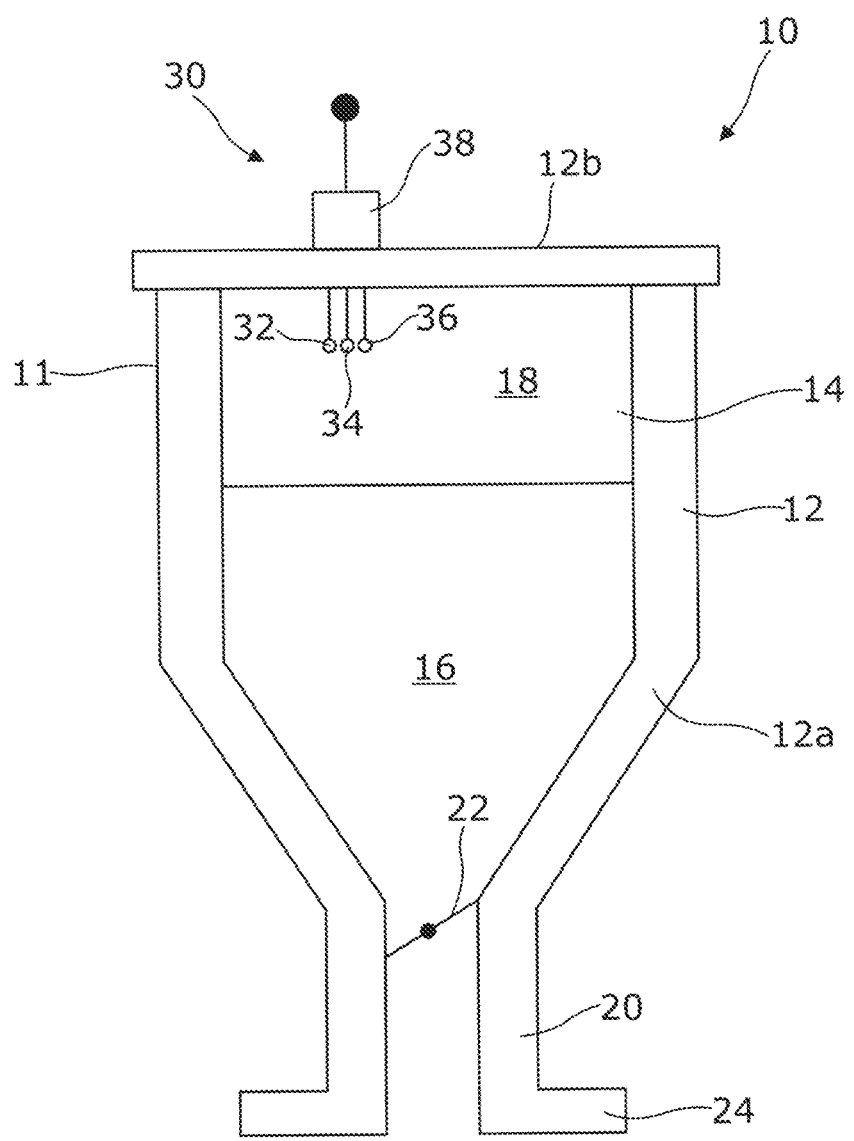
FIG. 1 is a schematic view of an embodiment of a container according to an aspect of the present invention.

As illustrated schematically in FIG. 1, a container assembly 10 for storing and/or transporting a powder, and in particular metallic powder used in additive manufacturing (AM), includes a container 11 having a first body 12 which defines a pressure chamber 14 for holding a powder 16 (or other particulate material) and a quantity of pressurised gas 18. The container body 12 includes a part conical main body portion 12a and a removable lid 12b. The conical region of the main body portion 12a leads to an outlet 20 through which powder 16 in the chamber 14 can be dispensed. The outlet is selectively opened and closed by an outlet valve 22.

The outlet 20 has a flange 24 by means of which it can be connected to an inlet port of an AM machine in the manner disclosed in our co-pending International patent application published as WO 2016/046539 A2. The apparatus and methods for connecting the container 11 to an AM machine do not form part of the present invention and so will not be described in detail herein. The reader should refer to WO 2016/046539 A2 for further details if required. The contents of WO 2016/046539 A2, particularly in relation to the arrangements for connecting the container 10 to an AM machine, are hereby incorporated by reference.

The container assembly 10 also includes a monitoring or sensor system (indicated generally at 30) for monitoring the environment within the pressure chamber 14. The monitoring system 30 is illustrated schematically in FIG. 1 and comprises sensors 32, 34, 36 adapted to monitor various parameters of the gas 18 and/or powder 16 inside the container. The sensors 32, 34, 36 are located so as to be subject to the gas in the pressure chamber 14 and so may be located within the chamber itself or so as to be in fluid contact with the interior of the pressure chamber. The sensors 32, 34, 36 may include a temperature sensor, and/or a humidity sensor, and/or an oxygen level sensor, and/or an electrostatic sensor, and/or a pressure sensor, for example.

The monitoring system 30 has a control unit 38 which is fluidly isolated from the pressure chamber 14. The control unit 38 is adapted to record and log the sensor readings either continuously or periodically and has a communications module for relaying the sensor readings, or log files, to a remote monitoring station.

Figure 2:
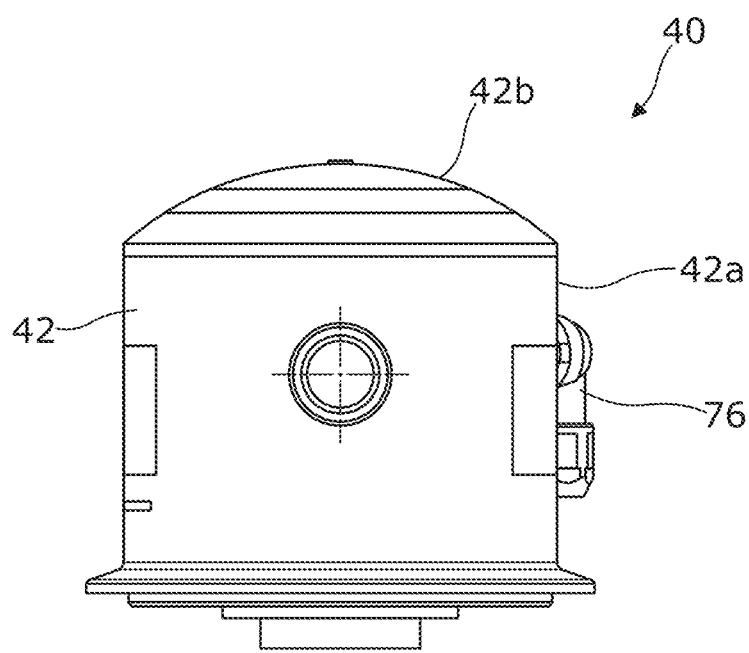
FIG. 2 is view of the side of a sensor module for use as part of the container of FIG. 1.
Figure 3:
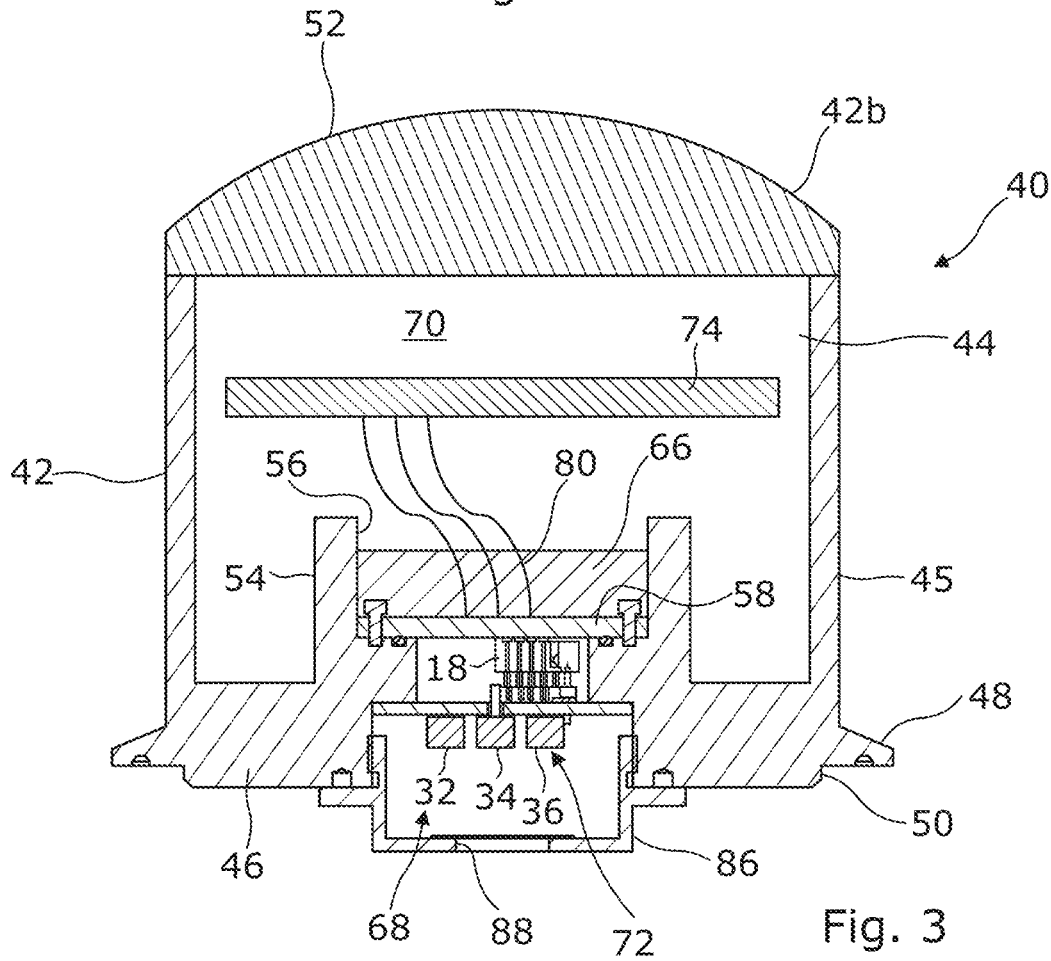
FIG. 3 is a somewhat schematic cross sectional view through the sensor module of FIG. 2.
Figure 4:
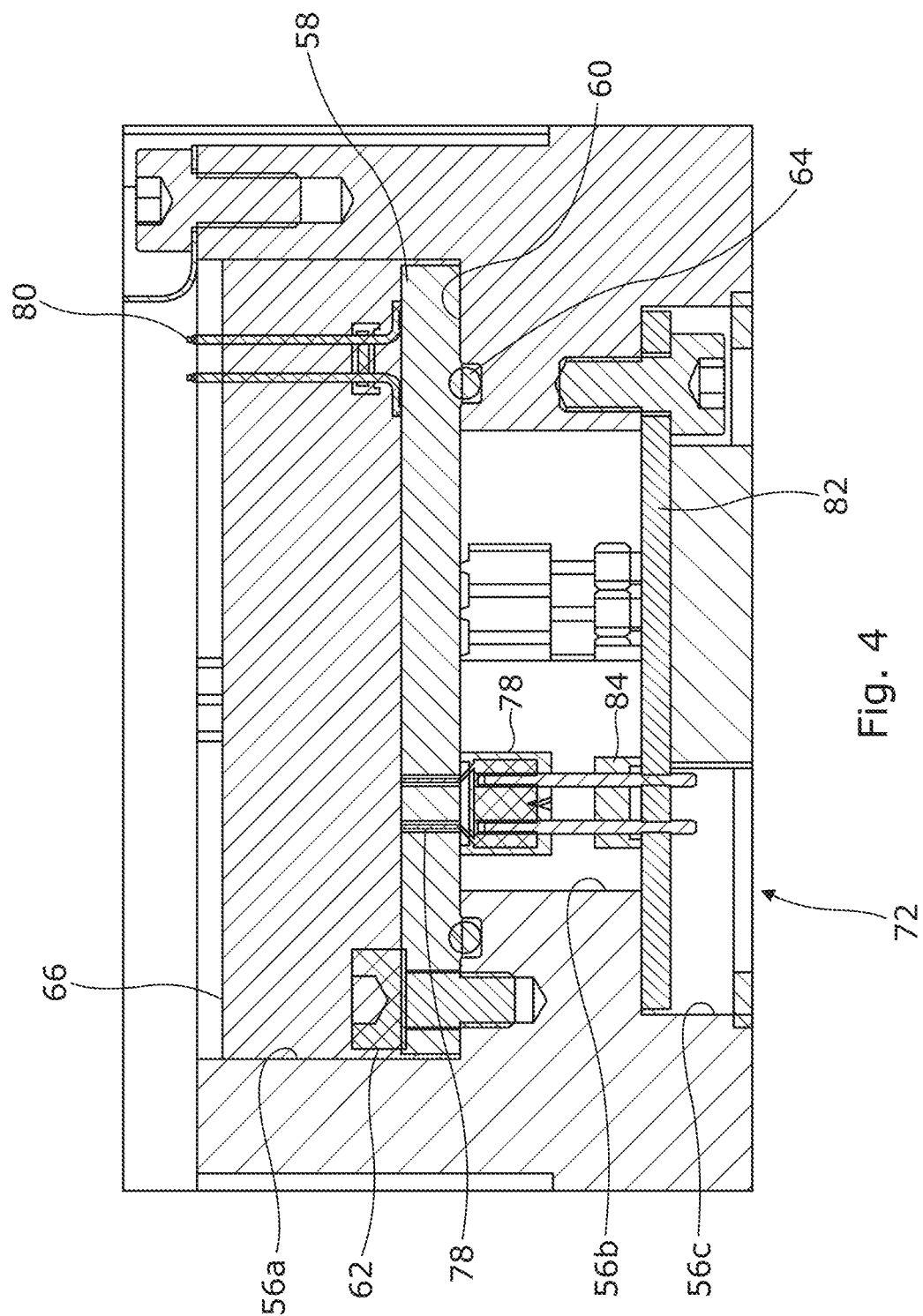
FIG. 4 is an enlarged view of part of the sensor module in FIG. 3.

Conveniently, the monitoring system 30 includes a sensor module which is removably mounted to the container body 12 and which houses at least some of the sensors 32, 34, 36 and the control unit 38. An embodiment of a sensor module 40 suitable for use with the container 11 is illustrated in FIGS. 2 to 4.

The sensor module 40 has a second, sensor module body 42 which defines a housing having an interior volume 44. The sensor module body 40 includes a main sensor module body portion 42 *a* and a removable end cap 42*b*. The main sensor module body portion 42 *a* has a generally cylindrical peripheral wall 45 and a base 46 which partially closes an inner end of the main sensor module body portion. The term "inner end" as used in relation to the sensor module as a whole refers to the end which attaches to the first body 12 of the container, the opposite end being referred to as the "outer end". At least the main sensor module body portion 42 *a* is made of a metallic material such as, for example, steel (including stainless steel), aluminium and aluminium alloys.

A flange 48 projects radially outwardly from the peripheral wall 45 close to its inner end so that small boss portion 50 of the base 46 projects inwardly beyond the flange. In use, the sensor module 40 is mounted to a connection port of the container body 12 having a corresponding flange using a tri-clamp and gasket to form a sealed connection.

The end cap 42*b* is releasably mounted to the main body portion 12*a* so as to engage with the outer end of the peripheral wall 45. The end cap is generally circular in shape when viewed in plan and the outer surface 52 of the end cap is curved, forming a dome shape. This is advantageous as it tends not to collect powder which may settle on it. The end cap 42*b* is releasably secured to the base 46 of the sensor main body 12*a* by any suitable method.

A central region of the base 46 of the sensor module main body portion 12*a* includes a circular boss 54. A stepped bore 56 extends through the boss 54 to define a passage, one end of which (the inner end) is fluidly connected with the interior of the pressure chamber 14 when the sensor module is mounted to the container 11.

The bore 56 has first portion 56*a* at an outer end which leads into an adjacent second portion 56*b* having a smaller diameter. The second portion in turn opens into third portion of the bore 56*c* which has a diameter larger than that of the second portion 56*b*. The third portion 56*b* of the bore opens at the inner surface of the base to form the above referenced one end of the passage which in use is fluidly connected with the interior of the pressure chamber 14. The opening at this end of the passage may be referred to as an external opening as it opens externally of the sensor body 42.

A first printed circuit board (PCB) 58 is mounted in the first portion 56*a* of the bore. The first PCB 58 is circular and has an outer diameter only slightly smaller than that of the first portion 56*a* of the bore. The first PCB sits on a shoulder 60 defined in the body between the first portion 56*a* and the adjacent smaller diameter second portion 56*b* of the bore 56. The first PCB is secured to the shoulder 60 using a number of screws 62 spaced apart on a common circumference which engage in corresponding threaded holes in the shoulder 60. A seal ring 64 is located between the first PCB and the shoulder radially inboard of the screws. The first PCB 58 extends across the bore at the entrance to the smaller diameter second portion 56*b* and forms a physical barrier closing off the bore 56. The first PCB is embedded within a layer of insulation material 66 in the first, larger diameter portion 56*a* of the bore. The insulation material 66 may be a potting compound and could be a melted glass or brazed ceramics, for example. In one embodiment, the insulating material 66 is Electrotemp Cement Powder No. 10 manufactured by Glassbond Sauereisen®. After the first PCB 58 has been successfully mounted in position, the insulating material 66 will typically be introduced into the bore 56*a* on top of the first PCB as a powder, paste, or viscous material and then cured.

The layer of insulation material 66 extends fully across the first portion 56*a* of the bore so that after curing, the first PCB and the insulating material layer 66 form a physical barrier which partitions the sensor module 40 into a first, hazardous region, indicated generally at 68, on the side of the barrier closest to said one end of the passage (the PCB side), and a second, non-hazardous region, indicated generally at 70, on the side of the barrier furthest from said one end of the passage (the insulating layer side). The barrier formed by the first PCB 58 and the layer of insulating material 66 is gas tight so that the second region 70, which includes the interior of the sensor module housing outside of the boss 80, is fluidly isolated from the first, hazardous region 68 and from the interior of the pressure chamber 14 when the sensor module is fitted to container 11.

The sensor module 40 includes electronic circuitry which is divided into first electronic circuity, indicated generally at 72, which is suitable for use in an explosive hazardous environment and second electronic circuitry, indicated generally at 74, which is not suitable for use in an explosive hazardous environment. The first electronic circuitry 72 is located within the first region 68 of the sensor module where it is exposed (fluidly connected) to the interior of the pressure chamber 14. The first electronic circuitry may be "intrinsically safe" and will typically include at least some of the sensors 32, 34, 36. The second electronic circuitry 74 includes other components of the sensor arrangement, at least some of which may not be safe to use in a potentially explosive, hazardous environment. The majority of second electronic circuity 74 is located within the sensor module housing 42 in the second, non-hazardous region 70 on the distal side of the barrier formed by the first PCB 58 and the layer of insulating material 66 where it is fluidly isolated from the interior of the pressure chamber 14. In practice, only those parts of the monitoring system electronics which must be located in the first region 68 are included in the first electronic circuitry 72 and these are configured to be safe for use in that environment. All other parts of the monitoring system electronics are incorporated in the second electronic circuitry 74 so as to be segregated and fluidly isolated from the interior of the pressure chamber 14.

The precise nature of the first and second electronic circuitry 72, 74 is not relevant to the present invention in its broadest sense and can be varied depending on the requirements of any given application. However, in the present embodiment, the second electronic circuitry 74 will typically include the control unit 38 which may be similar to that described in our co-pending International patent application published as WO 2016/046539 A2. The control unit 38 could include, for example, an Electronic Control Unit (ECU) which may have a module (e.g. a PIC and memory device) adapted record and log the sensor readings either continuously, or at intervals, a GSM module, a GPS unit; an antenna; and a power supply such as a battery pack.

The sensor arrangement may also include further sensors and other electronic components not located within the pressure chamber 14 or within the sensor module housing 42 itself but which are electronically connected with control unit 38. This might include a strain gauge or weighing device for monitoring and/or logging the weight of the contents of the pressure vessel; and/or an accelerometer, vibration sensor or gyroscope adapted to monitor and/or log movement of the container, and in particular, vibration and shocks for example. Such components may be mounted to the container 11 externally of the pressure chamber 14 and connected to the control unit 38 and/or other electronics within the sensor module by suitable means, such as a multi-pin connector 76 or USB connector.

In order to electronically interconnect the first and second electronic circuitry 72, 74, the first PCB 58 has at least one first connector 78 on the side facing into the second portion 56b of the bore which is connected with the first electronic circuitry 72 and at least one second connector 80 extending through the layer of insulation material 66 on the other side of the first PCB and which is connected with the second electronic circuitry 74. The second connector 80 in this embodiment is conveniently in the form of a pin connector. The first and second connectors 78, 80 are electronically coupled through the first PCB 58 by conductive tracks so that the first electronic circuitry 72 is electronically connected with the second electronic circuitry 74 through the first PCB 58. There may be more than one first connector 78 and/or there may be more than one second connector 80, each being connected with respective parts of the first and second electronic circuitry and variously coupled through the first PCB 58 as required. There may be no other components on the first PCB 58 which could alternatively be called a first printed wiring board.

In the present embodiment, the first electronic circuit 72 includes a second PCB 82 to which the sensors 32, 34, 36 are mounted. The second PCB 82 has one or more connectors 84 which are each coupled with a respective first connector 78 of the first PCB 58.

A filter housing 86 is mounted to the inner surface (i.e. the surface which is directed toward the interior of the pressure chamber 14 in use) of the base 46 over the opening of the bore 56. The filter housing has a filtered aperture 88 through which gas must pass to enter the bore 56 from the pressure chamber 14. The filter may be a PTFE filter. The filter prevents, or at least resists, entry of powdered material into the bore 56 from the pressure chamber 14.

In use, the barrier created by the first PCB 58 and the layer of insulation material 66 fluidly isolates the second electronic circuity 74 from the hazardous environment inside the pressure chamber 14 reducing the risk of an explosion being caused by an ignition source in the second electronic circuitry. In addition, the barrier insulates the first electronic circuitry 72 from overheating of components in the second electronic circuitry, such as the batteries for example.

The above embodiment is described by way of example only. Many variations are possible without departing from the scope of the invention. For example, whilst an embodiment of the invention has been described in relation to a sensor module 40 for a pressurised metal powder container 11, it will be appreciated that the sensor module could be adapted for use with other types of apparatus where there is a need to monitor a hazardous environment. The sensor module 40 as described above could be adapted for use with containers, pressurised or otherwise, for storing and/or transporting materials other than metallic powders. This could include containers for storing and/or transporting non-metal powders and other non-powder materials such as gasses and liquids. The sensor module 40 could also be adapted for use with other types of material handling and processing equipment where monitoring of a hazardous environment is required, such as a powder sieve for example. Indeed, the underlying concept of partitioning or fluidly isolating "safe" electronic circuitry suitable for use in a hazardous environment from "un-safe" electronic circuitry whilst maintaining electrical connectivity between them by means of a gas tight barrier created in a passageway using a PCB and a layer of insulating material and using the PCB to establish an electrical connection between the safe and un-safe electronic circuitry can be adopted in a wide range of applications where it is necessary to place safe parts of an electronic system within a hazardous environment and electronically connect them with un-safe parts of the circuit in a manner that effectively isolates the un-safe parts from the hazardous environment. Such applications could include a wide range of process equipment and equipment for storage and/or transport of potentially hazardous materials.

The invention claimed is:

1. Apparatus including a safety circuit arrangement for electronically interconnecting first electronic circuitry in a hazardous environment with second electronic circuitry whilst partitioning the second electronic circuitry from the hazardous environment, the apparatus comprising:
   a) a body defining a passage which opens at one end into the hazardous environment;
   b) a PCB mounted to the body so as to extend across and close the passage, the PCB being encased within a layer of insulating material on the side of the PCB facing away from said one end of the passage, the PCB and insulating layer forming a gas tight barrier across the passage;
   c) the PCB having at least one first connector connected with said first electronic circuitry located in the hazardous environment and at least one second connector extending through the layer of insulating material and connected with said second electronic circuitry; and
   d) the at least one first connector and the at least one second connector being electronically coupled such that the first electronic circuitry is electronically connected with the second electronic circuitry through the PCB and insulating layer,
   wherein the passage comprises a stepped bore defined in the body, the stepped bore having adjacent first and second portions, the first portion having a larger diameter than the second portion and the body defining a shoulder at an intersection of the first and second portions of the bore, wherein the shoulder is directed away from said one end of the passage, the PCB being mounted to the shoulder within the first portion of the bore,
   wherein the stepped bore comprises a third portion adjacent the second portion at an opposite end of the second portion from the first portion, the third portion having a larger diameter than the second portion and the body defining a second shoulder at an intersection between the second and third portions of the bore, wherein the second shoulder is directed toward said one end of the passage, the first electronic circuitry including a further PCB mounted to the second shoulder within the third portion of the bore and electronically coupled to the first PCB.

2. Apparatus as claimed in claim 1, wherein the apparatus comprises a sensor arrangement for monitoring one or more characteristics in the hazardous environment, the first electronic circuitry comprising at least one sensor for monitoring one or more parameters of the hazardous environment and the second electronic circuitry comprising other components of the sensor arrangement.

3. Apparatus as claimed in claim 2, wherein the at least one sensor comprises any one or more selected from the group comprising: an oxygen sensor; a humidity sensor; an electrostatic sensor; a temperature sensor; and a pressure sensor.

4. Apparatus as claimed in claim 2, wherein the other components of the sensor arrangement comprise any one or more selected from the group comprising: a battery; an ECU; a PIC; a communications unit; an antenna.

5. Apparatus as claimed in claim 1, wherein the apparatus forms part of a module which, when in use, is mounted to a container having an interior volume such that said passage is fluidly connected at said one end with the interior volume.

6. Apparatus as claimed in claim 5, wherein the module is releasably mountable to said container.

7. Apparatus as claimed in claim 1, wherein at least that part of the body which defines the passage is made of a metallic material.

8. Apparatus as claimed in claim 1, wherein the insulating layer is selected from the group comprising: a potting compound, melted glass, or brazed ceramics.

9. Apparatus as claimed in claim 1, wherein a seal is provided between the PCB and the shoulder.

10. Apparatus as claimed in claim 1, wherein the body defines a housing within which at least part of the second electronic circuitry is contained.

11. Apparatus as claimed in claim 1, wherein a filter is provided to filter fluid entering the passage through said one end.

12. Apparatus as claimed in claim 11 wherein a filter cover is mounted to the body defining the passage to enclose an opening of the passage at said one end, the filter cover having a filtered aperture through which fluid passes to enter the passage.

13. Apparatus comprising a container having an interior volume and an electronic module, the electronic module comprising a body defining a passage connected at one end with the interior volume of the container, the apparatus further comprising:
   a) a PCB mounted to the body so as to extend across and close the passage, the PCB having a first side proximal said one end of the passage and a second side distal from said one end of the passage, the PCB being encased within a layer of insulating material which extends across the passage on the second side of the PCB, the PCB and insulating layer forming a gas tight barrier which partitions the apparatus into a hazardous region to the side of the barrier proximal said one end of the passage and a non-hazardous region to the side of the barrier distal from said one end of the passage, the hazardous and non-hazardous regions being fluidly isolated from one another by said barrier;
   b) the PCB having at least one first connector connected with said first electronic circuitry located in the hazardous region and at least one second connector extending through the layer of insulating material and connected with said second electronic circuitry located in the non-hazardous region; and
   c) the at least one first connector and the at least one second connector being electronically coupled such that the first electronic circuitry is electronically connected with the second electronic circuitry through the PCB and the insulating layer,
      wherein the container is a pressurized container and wherein the interior volume of the container is a pressure chamber for holding a quantity of pressurized gas and a quantity of powder.

14. Apparatus as claimed in claim 13, wherein the electronic module comprises a sensor arrangement for monitoring one or more parameters of the interior volume of the container, the first electronic circuitry comprising at least one sensor for monitoring one or more parameters of the interior volume and the second electronic circuitry comprises other components of the sensor arrangement.

15. Apparatus comprising a sensor module for monitoring one or more parameters of an interior volume of a pressurised powder container, the sensor module having a body defining a passage and being mountable to the pressurised powder container such that the passage is connected at one end with an interior volume of the container, the apparatus further comprising:
   a) a PCB mounted to the body so as to extend across and close the passage, the PCB having a first side proximal said one end of the passage and a second side distal from said one end of the passage, the PCB being encased within a layer of insulating material which extends across the passage on the second side of the PCB, the PCB and insulating layer forming a gas tight barrier which partitions the apparatus into a hazardous region to the side of the barrier proximal said one end of the passage and a non-hazardous region to the side of the barrier distal from said one end of the passage, the hazardous and non-hazardous regions being fluidly isolated from one another by said barrier;
   b) the PCB having at least one first connector connected with said first electronic circuitry located in the hazardous region and at least one second connector extending through the layer of insulating material and connected with said second electronic circuitry located in the non-hazardous region; and
   c) the at least one first connector and the at least one second connector being electronically coupled such that the first electronic circuitry is electronically connected with the second electronic circuitry through the PCB and insulating layer.

16. Apparatus as claimed in claim 15, wherein the first electronic circuitry comprises at least one sensor for monitoring one or more parameters of the interior volume of a container in use and the second electronic circuitry comprises other components of the sensor arrangement.

17. Apparatus including a safety circuit arrangement for electronically interconnecting first electronic circuitry in a hazardous environment with second electronic circuitry whilst partitioning the second electronic circuitry from the hazardous environment, the apparatus comprising:
   a) a body defining a passage which opens at one end into the hazardous environment;
   b) a PCB mounted to the body so as to extend across and close the passage, the PCB being encased within a layer of insulating material on the side of the PCB facing away from said one end of the passage, the PCB and insulating layer forming a gas tight barrier across the passage;
   c) the PCB having at least one first connector connected with said first electronic circuitry located in the hazardous environment and at least one second connector extending through the layer of insulating material and connected with said second electronic circuitry;
   d) the at least one first connector and the at least one second connector being electronically coupled such that the first electronic circuitry is electronically connected with the second electronic circuitry through the PCB and insulating layer, and
   e) a filter to filter fluid entering the passage through said one end.

18. Apparatus as claimed in claim 17, further including a filter cover mounted to the body defining the passage to enclose an opening of the passage at said one end, the filter cover having a filtered aperture through which fluid passes to enter the passage.

* * * * *